(12) United States Patent
Wu et al.

(10) Patent No.: US 12,327,862 B2
(45) Date of Patent: Jun. 10, 2025

(54) ELECTROLYTIC COPPER FOIL AND PREPARATION METHOD THEREFOR, NEGATIVE ELECTRODE PLATE, SECONDARY BATTERY, BATTERY MODULE, BATTERY PACK AND POWER CONSUMING DEVICE

(71) Applicant: CONTEMPORARY AMPEREX TECHNOLOGY (HONG KONG) LIMITED, Hong Kong (CN)

(72) Inventors: Yukun Wu, Ningde (CN); Xiaoming Ge, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 257 days.

(21) Appl. No.: 18/334,552

(22) Filed: Jun. 14, 2023

(65) Prior Publication Data

US 2023/0323556 A1    Oct. 12, 2023

Related U.S. Application Data

(63) Continuation of application No. PCT/CN2022/093668, filed on May 18, 2022.

(30) Foreign Application Priority Data

Sep. 10, 2021 (CN) .......................... 202111062005.3

(51) Int. Cl.
*H01M 4/139* (2010.01)
*C25D 3/38* (2006.01)
(Continued)

(52) U.S. Cl.
CPC .............. *H01M 4/139* (2013.01); *C25D 3/38* (2013.01); *C25D 5/20* (2013.01); *C30B 7/12* (2013.01);
(Continued)

(58) Field of Classification Search
CPC ............ C25D 5/20; C25D 5/617; C25D 7/00; H01M 4/661; H01M 4/667; H01M 4/0404;
(Continued)

(56) References Cited

U.S. PATENT DOCUMENTS

| 4,647,345 A | 3/1987 | Polan |
| 2002/0015833 A1 | 2/2002 | Takahashi et al. |

(Continued)

FOREIGN PATENT DOCUMENTS

| CN | 1335419 A | * | 2/2002 | .......... B01F 11/0082 |
| CN | 1337475 A | | 2/2002 | |

(Continued)

OTHER PUBLICATIONS

State Intellectual Property Office of China Notice of Grant of Invention Patent Right for Application No. 202111062005.3 Jun. 6, 2023 8 pages (including translation).

(Continued)

*Primary Examiner* — Imran Akram
(74) *Attorney, Agent, or Firm* — ANOVA LAW GROUP, PLLC (57) ABSTRACT

A method for preparing an electrolytic copper foil includes placing an anode and a cathode to be plated in a twin crystal growth agent containing electroplating solution in an electroplating tank, and, under conditions that the electroplating solution is provided with randomly alternating transitions of one or two of an ultrasonic wave at a frequency f11 and an ultrasonic wave at a frequency f12 and one or two of an ultrasonic wave at a frequency f21 and an ultrasonic wave at a frequency f22, performing direct current electroplating to obtain the electrolytic copper foil, wherein f11>40 kHz, 15 kHz<f12≤40 kHz, 0 kHz<f21≤15 kHz, and f22=0 kHz.

6 Claims, 3 Drawing Sheets

(51) Int. Cl.
- C25D 5/20 (2006.01)
- C30B 7/12 (2006.01)
- C30B 30/06 (2006.01)
- H01M 4/04 (2006.01)
- H01M 4/66 (2006.01)

(52) U.S. Cl.
CPC ........... C30B 30/06 (2013.01); H01M 4/0404 (2013.01); H01M 4/0452 (2013.01); H01M 4/661 (2013.01)

(58) Field of Classification Search
CPC ...... H01M 4/13; H01M 4/139; H01M 4/0452; C30B 30/06
See application file for complete search history.

(56) References Cited

U.S. PATENT DOCUMENTS

| | | |
|---|---|---|
| 2010/0170801 A1 | 7/2010 | Metzger |
| 2020/0080214 A1 | 3/2020 | Chen et al. |
| 2020/0083539 A1 | 3/2020 | Chen et al. |
| 2020/0236782 A1 | 7/2020 | Ho et al. |

FOREIGN PATENT DOCUMENTS

| | | | | |
|---|---|---|---|---|
| CN | 1974870 | A | | 6/2007 |
| CN | 101831680 | A * | | 9/2010 |
| CN | 105316728 | A * | | 2/2016 |
| CN | 105401183 | A * | | 3/2016 |
| CN | 106544704 | A * | | 3/2017 |
| CN | 109082688 | A | | 12/2018 |
| CN | 109898106 | A * | 6/2019 | ............... C25D 1/04 |
| CN | 111304712 | A | | 6/2020 |
| CN | 112317972 | A | | 2/2021 |
| CN | 112779572 | A | | 5/2021 |
| EP | 1182278 | A2 | | 2/2002 |
| EP | 2557614 | A1 * | 2/2013 | ............. B23K 26/20 |
| JP | 2628184 | B2 * | 7/1997 | ............... C25D 5/08 |
| JP | 2002053993 | A | | 2/2002 |
| JP | 2004256910 | A | | 9/2004 |
| JP | 5004378 | B2 * | | 8/2012 |
| JP | 2013133514 | A | | 7/2013 |
| JP | 2014009365 | A | | 1/2014 |
| JP | 6355006 | B1 | | 7/2018 |
| KR | 20020012118 | A | | 2/2002 |
| KR | 20180040068 | A | | 4/2018 |
| RU | 2449061 | C1 * | | 4/2012 |
| TW | 583346 | B | | 4/2004 |

OTHER PUBLICATIONS

The European Patent Office (EPO) The Extended European Search Report for Application No. 22866139.3, Apr. 8, 2024 11 Pages.

S. Coleman et al., "Electrodeposition of copper patterns using Enface technique under ultrasonic agitation." Journal of Applied Electrochemistry 45 (2015): 889-898.

Cheng Cui. "Research and Development of Microporous Copper Foil Preparation Device and Process", MS thesis. Shandong University of Technology, 2020.

Guirong He et al., "Application of ultrasonic wave in preparation of ultra-thin copper foil." World Nonferrous Metals 12 (2010): 47-49.

Shaozhuo Wang, "Study on electrolytic refining of copper by AC-DC superposition", Diss. Shandong: Shandong University of Technology, 2010.

The Japan Patent Office (JPO) Notification of Reasons for Refusal for Application No. 2023-531543 Jul. 22, 2024 12 Pages (including translation).

The World Intellectual Property Organization (WIPO) International Search Report for PCT/CN2022/093668 Aug. 23, 2022 4 pages (including English translation).

* cited by examiner

ELECTROLYTIC COPPER FOIL AND PREPARATION METHOD THEREFOR, NEGATIVE ELECTRODE PLATE, SECONDARY BATTERY, BATTERY MODULE, BATTERY PACK AND POWER CONSUMING DEVICE

CROSS-REFERENCE TO RELATED APPLICATIONS

The present application is a continuation of International Application No. PCT/CN2022/093668, filed on May 18, 2022, which claims priority to Chinese patent application no. 202111062005.3, entitled "electrolytic copper foil and preparation method therefor, negative electrode plate, and secondary battery", filed on Sep. 10, 2021, the entire contents of which are incorporated herein by reference.

TECHNICAL FIELD

The present application belongs to the technical field of secondary batteries, and in particular relates to an electrolytic copper foil and a preparation method therefor, a negative electrode plate, a secondary battery, a battery module, a battery pack, and a power consuming device.

BACKGROUND ART

Copper foil is commonly used as a negative electrode current collector of a secondary battery. The copper foil currently used mainly includes a rolled copper foil based on a rolling process and an electrolytic copper foil based on an electroplating process. The rolled copper foil has high technical requirements, a complicated process and high costs, so it is not suitable for large-scale production. Therefore, the research focus gradually moves to the electrolytic copper foil. However, in order to meet the current requirements of a high-quality energy density for secondary batteries, the electrolytic copper foil should not only be thinner but also guarantee a sufficient tensile strength and a hardness. The mechanical properties of the existing electrolytic copper foil can no longer meet the requirements of a secondary battery with a high-quality energy density, and in the cold-pressing process of negative electrode plates, crumpling, breakage, etc., often occurs, which greatly affects the production efficiency of secondary batteries.

SUMMARY

An objective of the present application is to provide an electrolytic copper foil and a preparation method therefor, a negative electrode plate, a secondary battery, a battery module, a battery pack, and a power consuming device, which aims not only to improve the production efficiency of the electrolytic copper foil, but also enable the electrolytic copper foil to have a higher degree of isotropy and a higher content of twin crystals, as well as more excellent electrical conductivity and mechanical properties.

A first aspect of the present application provides a method for preparing an electrolytic copper foil, including the steps of S10, placing an anode, and a cathode to be plated in a twin crystal growth agent containing electroplating solution in an electroplating tank; and S20, under conditions that the electroplating solution is provided with randomly alternating transitions of one or two of an ultrasonic wave at an f11 frequency and an ultrasonic wave at an f12 frequency and one or two of an ultrasonic wave at an f21 frequency and an ultrasonic wave at an f22 frequency, performing direct current electroplating to obtain the electrolytic copper foil, wherein $f11>40$ kHz, $15$ kHz$<f12\leq 40$ kHz, $0$ kHz$<f21\leq 15$ kHz, and $f22=0$ kHz.

The method for preparing an electrolytic copper foil of the present application can allow the growth of the nano-copper microstructures that have highly preferred orientation for the (111) crystal plane in different directions at a high current density. The method not only improves the production efficiency of the electrolytic copper foil, but also enables the electrolytic copper foil to have a higher degree of isotropy and a higher content of twin crystals, as well as more excellent electrical conductivity and mechanical properties.

In any embodiment of the present application, $40$ kHz$<f11\leq 100$ kHz.

In any embodiment of the present application, in the process of obtaining the electrolytic copper foil by means of electroplating, the percentage of the total time for electroplating under conditions of an ultrasonic wave at f11 frequency and an ultrasonic wave at f12 frequency is 70%-90%, and the percentage of the total time for electroplating under conditions of an ultrasonic wave at f21 frequency and an ultrasonic wave at f22 frequency is 10%-30%.

In any embodiment of the present application, in the process of obtaining the electrolytic copper foil by means of electroplating, the percentage of the total time for electroplating under conditions of an ultrasonic wave at f11 frequency and an ultrasonic wave at f12 frequency is 75%-85%, and the percentage of the total time for electroplating under conditions of an ultrasonic wave at f21 frequency and an ultrasonic wave at f22 frequency is 15%-25%.

With the total time for electroplating under conditions of an ultrasonic wave at f11 frequency and an ultrasonic wave at f12 frequency in a suitable range, in the electrolytic copper foil, the volume percentage of the twining crystal grains is higher, and the volume percentage of the (111) crystal plane is higher as well.

In any embodiment of the present application, in the process of obtaining the electrolytic copper foil by means of electroplating, the percentage of the time for electroplating under conditions of an ultrasonic wave at f11 frequency is 40%-90%. Optionally, the percentage of the time for electroplating under conditions of an ultrasonic wave at f11 frequency is 40%-50%. With the percentage of the time for electroplating under conditions of an ultrasonic wave at f11 frequency in a suitable range, in the electrolytic copper foil, the volume percentage of the twining crystal grains is higher, and the volume percentage of the (111) crystal plane is higher as well.

In any embodiment of the present application, in the process of obtaining the electrolytic copper foil by means of electroplating, the percentage of the time for electroplating under conditions of an ultrasonic wave at f12 frequency is 0-50%. Optionally, the percentage of the time for electroplating under conditions of an ultrasonic wave at f12 frequency is 40%-50%.

In any embodiment of the present application, in the process of obtaining the electrolytic copper foil by means of electroplating, the percentage of the time for electroplating under conditions of an ultrasonic wave at f21 frequency is 0-30%. Optionally, the percentage of the time for electroplating under conditions of an ultrasonic wave at f21 frequency is 5%-25%.

In any embodiment of the present application, in the process of obtaining the electrolytic copper foil by means of electroplating, the percentage of the time for electroplating under conditions of an ultrasonic wave at f22 frequency is 0-10%. Optionally, the percentage of the time for electroplating under conditions of an ultrasonic wave at f22 frequency is 5%-10%.

In any embodiment of the present application, the current density for the direct current electroplating is 2 A/dm$^2$-80 A/dm$^2$. Optionally, the current density for the direct current electroplating is 15 A/dm$_2$-80 A/dm$^2$. The electrolytic copper foil of the present application can also allow the electroplating at a high current density, such that the time for electroplating is reduced and the production efficiency is improved.

In any embodiment of the present application, the twin crystal growth agent includes one or two of gelatin and polyethyleneimine.

In any embodiment of the present application, the electroplating solution is a sulfuric acid-copper sulfate electroplating solution, and the electroplating solution further comprises copper ions, sulfuric acid, and chloride ions.

In any embodiment of the present application, the concentration of copper ions in the electroplating solution is 50 g/L-100 g/L. Optionally, the concentration of copper ions in the electroplating solution is 70 g/L-80 g/L. With the concentration of copper ions in a suitable range, it not only can realize electroplating at a high current density, but also can improve the effect of electroplating and the quality of the plated layer.

In any embodiment of the present application, the concentration of sulfuric acid in the electroplating solution is 40 g/L-70 g/L. Optionally, the concentration of sulfuric acid in the electroplating solution is 50 g/L-60 g/L. With the concentration of sulfuric acid in a suitable range, the effect of electroplating and the quality of the plated layer are better.

In any embodiment of the present application, the mass concentration of chloride ions in the electroplating solution is 20 ppm-50 ppm. Optionally, the mass concentration of chloride ions in the electroplating solution is 30 ppm-40 ppm. With the concentration of chloride ions in a suitable range, the plated layer has better leveling performance and brightness.

In any embodiment of the application, the mass concentration of the twin crystal growth agent in the electroplating solution is 50 ppm-110 ppm. Optionally, the mass concentration of the twin crystal growth agent in the electroplating solution is 70 ppm-90 ppm. With the concentration of the twin crystal growth agent in a suitable range, the quality of the plated layer can be improved, and the degree of isotropy and the content of twin crystals of the electrolytic copper foil are also improved.

In any embodiment of the present application, the electroplating solution further comprises a leveling agent and a brightening agent.

In any embodiment of the present application, the leveling agent includes polypeptide protein.

In any embodiment of the present application, the brightening agent includes one or more of sodium polydithiodipropane sulfonate and sodium 3-mercaptopropane sulfonate.

In any embodiment of the present application, the concentration of the leveling agent in the electroplating solution is 20 ml/L-40 ml/L. Optionally, the concentration of the leveling agent in the electroplating solution is 25 ml/L-35 ml/L. With the concentration of the leveling agent in a suitable range, the micro-throwing power of the electroplating solution can be improved, such that the surface of the plated layer is smoother.

In any embodiment of the present application, the concentration of the brightening agent in the electroplating solution is 10 ml/L-30 ml/L. Optionally, the concentration of the brightening agent in the electroplating solution is 15 ml/L-25 ml/L. With the concentration of the brightening agent in a suitable range, the brightness and the brightness range of the plated layer can be improved.

A second aspect of the present application provides an electrolytic copper foil, which is prepared by the method according to the first aspect of the present application.

In any embodiment of the present application, the volume percentage of the (111) crystal plane of the electrolytic copper foil is ≥60%. Optionally, the volume percentage of the (111) crystal plane of the electrolytic copper foil is ≥80%.

In any embodiment of the present application, the volume percentage of the twining crystal grains in the electrolytic copper foil is ≥60%. Optionally, the volume percentage of the twining crystal grains in the electrolytic copper foil is ≥80%.

In any embodiment of the present application, the normal-temperature tensile strength of the electrolytic copper foil is ≥50 kg/mm$^2$. Optionally, the normal-temperature tensile strength of the electrolytic copper foil is ≥60 kg/mm$^2$.

In any embodiment of the present application, the Vickers hardness of the electrolytic copper foil is ≥180. Optionally, the Vickers hardness of the electrolytic copper foil is ≥190.

A third aspect of the present application provides a negative electrode plate, comprising an electrolytic copper foil prepared by the method according to the first aspect of the present application or an electrolytic copper foil according to the second aspect of the present application.

In any embodiment of the present application, the negative electrode plate further comprises a negative electrode film layer, the negative electrode film layer is provided on at least one surface of the electrolytic copper foil, and the adhesive force between the electrolytic copper foil and the negative electrode film layer is 10 N/m$^2$-20 N/m$^2$.

A fourth aspect of the present application provides a secondary battery, comprising a negative electrode plate of the third aspect of the present application.

A fifth aspect of the present application provides a battery module, comprising a secondary battery of the fourth aspect of the present application.

A sixth aspect of the present application provides a battery pack, comprising one of a secondary battery of the fourth aspect of the present application and a battery module of the fifth aspect of the present application.

A seventh aspect of the present application provides a power consuming device, comprising at least one of a secondary battery of the fourth aspect of the present application, a battery module of the fifth aspect of the present application and a battery pack of the sixth aspect of the present application.

The battery module, the battery pack and the power consuming device of the present application comprise the secondary battery provided by the present application, and thus have at least the same advantages as the secondary battery.

BRIEF DESCRIPTION OF THE DRAWINGS

In order to more clearly illustrate the technical solutions of the embodiments of the present application, the drawings to be used in the description of the embodiments of the present application will be described briefly below. Obviously, the drawings in the following description are merely some embodiments of the present application. For those skilled in the art, other drawings can also be obtained according to these drawings without the inventive labor.

DETAILED DESCRIPTION OF EMBODIMENTS

Hereinafter, embodiments of the electrolytic copper foil and the preparation method therefor, the negative electrode plate, the secondary battery, the battery module, the battery pack, and the power consuming device of the present application are described in detail and specifically disclosed with reference to the accompanying drawings as appropriate. However, unnecessary detailed illustrations may be omitted in some instances. For example, there are situations where detailed description of well known items and repeated description of actually identical structures are omitted. This is to prevent the following description from being unnecessarily verbose, and facilitates understanding by those skilled in the art. Moreover, the accompanying drawings and the descriptions below are provided for enabling those skilled in the art to fully understand the present application, rather than limiting the subject matter disclosed in claims.

"Ranges" disclosed in the present application are defined in the form of lower and upper limits, and a given range is defined by selection of a lower limit and an upper limit, the selected lower and upper limits defining the boundaries of the particular range. Ranges defined in this manner may be inclusive or exclusive, and may be arbitrarily combined, that is, any lower limit may be combined with any upper limit to form a range. For example, if the ranges of 60-120 and 80-110 are listed for a particular parameter, it should be understood that the ranges of 60-110 and 80-120 are also contemplated. Additionally, if minimum range values 1 and 2 are listed, and maximum range values 3, 4, and 5 are listed, the following ranges are all contemplated: 1-3, 1-4, 1-5, 2-3, 2-4, and 2-5. In the present application, unless stated otherwise, the numerical range "a-b" denotes an abbreviated representation of any combination of real numbers between a and b, where both a and b are real numbers. For example, the numerical range "0-5" means that all real numbers between "0-5" have been listed herein, and "0-5" is just an abbreviated representation of combinations of these numerical values. In addition, when a parameter is expressed as an integer of ≥2, it is equivalent to disclosing that the parameter is, for example, an integer of 2, 3, 4, 5, 6, 7, 8, 9, 10, 11, 12, and the like.

All the implementations and optional implementations of the present application can be combined with one another to form new technical solutions, unless otherwise stated.

All technical features and optional technical features of the present application can be combined with one another to form a new technical solution, unless otherwise stated.

Unless otherwise stated, all the steps of the present application can be performed sequentially or randomly, in some embodiments sequentially. For example, the method comprising steps (a) and (b) indicates that the method may comprise steps (a) and (b) performed sequentially, and may further include steps (b) and (a) performed sequentially. For example, reference to "the method may further comprise step (c)" indicates that step (c) may be added to the method in any order, e.g., the method may comprise steps (a), (b) and (c), steps (a), (c) and (b), or also steps (c), (a) and (b), etc.

The terms "comprise" and "include" mentioned in the present application are open-ended, unless otherwise stated. For example, "comprise" and "include" may mean that other components not listed may further be comprised or included.

In the present application, the term "or" is inclusive unless otherwise specified. For example, the phrase "A or B" means "A, B, or both A and B". More specifically, a condition "A or B" is satisfied by any one of the following: A is true (or present) and B is false (or not present); A is false (or not present) and B is true (or present); or both A and B are true (or present). In this disclosure, the phrases "at least one of A, B, and C" and "at least one of A, B, or C" both mean only A, only B, only C, or any combination of A, B, and C.

Method for Preparing Electrolytic Copper Foil

Although the electrolytic copper foil prepared by a direct current electroplating process has higher mechanical properties, the resulting electrolytic copper foil is prone to orient preferentially at the (111) crystal plane; as a result, the electrolytic copper foil is anisotropic in whole or locally anisotropic, and the electrolytic copper foil must have relatively weak mechanical properties in one direction. In order to eliminate the overall and local anisotropy of the electrolytic copper foil, the method generally used in the related art is electroplating at a very small current density (e.g., 2 $A/dm^2$-8 $A/dm^2$) to ensure that the nano-copper crystal grains can grow in different directions during electroplating. However, this method requires an extremely long electroplating time, has a low production efficiency, and is not suitable for large-scale production.

By a lot of research, the inventors provide a new method for preparing an electrolytic copper foil. The method can allow the growth of the nano-copper microstructures that have highly preferred orientation for the (111) crystal plane in different directions at a high current density. The method not only improves the production efficiency of the electrolytic copper foil, but also enables the resulting electrolytic copper foil to have a higher degree of isotropy and a higher content of twin crystals, as well as more excellent electrical conductivity and mechanical properties.

Specifically, The method for preparing an electrolytic copper foil of the present application includes the steps of S10, placing an anode, and a cathode to be plated in a twin crystal growth agent containing electroplating solution in an electroplating tank; and S20, under conditions that the electroplating solution is provided with randomly alternating transitions of one or two of an ultrasonic wave at an f11 frequency and an ultrasonic wave at an f12 frequency and one or two of an ultrasonic wave at an f21 frequency and an ultrasonic wave at an f22 frequency, performing direct current electroplating to obtain the electrolytic copper foil, wherein f11>40 kHz, 15 kHz<f12≤40 kHz, 0 kHz<f21≤15 kHz, and f22=0 kHz.

The mechanical properties in all directions of the electrolytic copper foil prepared by the method of the present application are significantly superior to those of a common copper foil, and the resulting electrolytic copper foil has a higher degree of isotropy and does not have a direction where the mechanical properties are weak.

Twin grain boundary is a special low-energy interface, the interface energy of which is about 1/10 of that of an ordinary large-angle grain boundary. Therefore, the introduction of twin crystals in a material can result in both a high strength and a good electrical conductivity. A twin crystal refers to two crystal grains or two parts of a crystal grain that are in minor symmetry along one twining plane. The relative orientation relationship, the twining plane index, and the twining growth direction of the two parts of a crystal that are twins to each other are fixed.

Both common crystal grains (non-twining crystal grains) and twining crystal grains comprise equiaxed grains and columnar grains. For equiaxed grains, their grain boundary area is large, the distribution of impurities and defects is relatively scattered, and the orientations of the equiaxed grains are different. Therefore, equiaxed grains are more uniform, stable and directionless. However, dendrites are well developed in equiaxed grains, with more microscopic shrinkage, and the crystal structure after solidification is not dense enough. The refining of the equiaxed grains enables the more scattered distribution of impurities and defects, which can further improve the performance of crystals; the finer the crystal grains, the better the overall performance, and the better the fatigue resistance. During the growth of columnar grains, the solidification area is narrow, which hinders the lateral growth of the columnar grains. Therefore, the growth of dendrites is not fully developed, with fewer branches, fewer microporosities and intergranular impurities occur after crystallization, and the crystal structure is relatively dense as well. However, the columnar grains are coarse and have a small grain boundary area and consistent orientations, so they show obvious directionality, that is, good longitudinal performance but poor lateral performance.

In the electroplating process, the twin crystal growth agent in the electroplating solution rapidly adheres to other crystal planes (e.g., (101) crystal plane, and (001) crystal plane) of the nano-copper crystal grains except the (111) crystal plane, such that the nano-copper crystal grains grow along the closest-packed plane of the (111) crystal plane during electroplating, inhibiting the growth of nano-copper crystal grains along other crystal planes. Therefore, the electrolytic copper foil can have more excellent electrical conductivity and mechanical properties.

In the process of electroplating, with the ultrasonic waves at different frequencies (one or two of an ultrasonic wave at f11 frequency and an ultrasonic wave at f12 frequency and one or two of an ultrasonic wave at f21 frequency and an ultrasonic wave at f22 frequency), the nano-copper crystal grains grow along different directions, which eliminates the local anisotropy and allows the growth of the nano-copper microstructure that has a higher degree of isotropy and a higher content of twin crystals, and thus the mechanical properties in all directions of the resulting electrolytic copper foil are significantly superior to those of a common copper foil.

In the process of electroplating, with the ultrasonic waves at different frequencies, the nano-copper crystal grains obtained by means of electroplating are more finer and more uniform; in the electrolytic copper foil, the volume percentage of the twining crystal grains (including twining equiaxed grains and twining columnar grains) is higher and the volume percentage of the (111) crystal plane is higher as well; and the electrolytic copper foil has a higher degree of isotropy, and more excellent electrical conductivity and mechanical properties.

In the process of electroplating with an ultrasonic wave at f11 frequency and an ultrasonic wave at f12 frequency, twining equiaxed grains are more prone to be generated; in the process of electroplating with an ultrasonic wave at f21 frequency and an ultrasonic wave at f22 frequency, twining columnar grains are more prone to be generated. The transition of ultrasonic waves at different frequencies (i.e., frequency transitions) can inhibit the growth of conventional crystal grains (i.e., non-twining crystal grains) and accelerate the growth of twining crystal grains (including twining equiaxed grains and twining columnar grains). In addition, in the process of electroplating, the transition of ultrasonic waves at different frequencies (i.e., frequency transitions) can better promote the adhesion of the twin crystal growth agent in the electroplating solution to other crystal planes (e.g., (101) crystal plane, and (001) crystal plane) of the nano-copper crystal grains except the (111) crystal plane, and provide a better environment for nano-copper crystal grains to grow along the (111) crystal plane. Therefore, the electrolytic copper foil not only has a higher degree of isotropy and a higher content of twin crystals, but also has more excellent electrical conductivity and mechanical properties.

A too high ultrasonic frequency may lead to a weak adhesion of the twin crystal growth agent to other crystal planes (e.g., (101) crystal plane, and (001) crystal plane) of the nano-copper crystal grains except the (111) crystal plane, such that the degree of isotropy and the content of twining crystal grains of the electrolytic copper foil are reduced. In some embodiments, optionally, 40 kHz<f11≤100 kHz. Particularly, 40 kHz<f11≤60 kHz.

In the present application, "frequency transition" refers to the transition of frequency between any two of an ultrasonic wave at f11 frequency, an ultrasonic wave at f12 frequency, an ultrasonic wave at f21 frequency, and an ultrasonic wave at f22 frequency. For example, the transition between an ultrasonic wave at f11 frequency and an ultrasonic wave at f12 frequency, the transition between an ultrasonic wave at f11 frequency and an ultrasonic wave at f21 frequency, the transition between an ultrasonic wave at f11 frequency and an ultrasonic wave at f22 frequency, the transition between an ultrasonic wave at f12 frequency and an ultrasonic wave at f21 frequency, the transition between an ultrasonic wave at f12 frequency and an ultrasonic wave at f22 frequency, and the transition between an ultrasonic wave at f21 frequency and an ultrasonic wave at f22 frequency. Moreover, the "frequency transition" in the present application does not include the transition from an ultrasonic wave at f11 frequency to another ultrasonic wave at f11 frequency, the transition from an ultrasonic wave at f12 frequency to another ultrasonic wave at f12 frequency, and the transition from an ultrasonic wave at f21 frequency to another ultrasonic wave at f21 frequency.

The "total number of frequency transitions" refers to the total number of frequency transitions between any two of an ultrasonic wave at f11 frequency, an ultrasonic wave at f12 frequency, an ultrasonic wave at f21 frequency, and an ultrasonic wave at f22 frequency during electroplating.

In some embodiments, in order to further eliminate the anisotropy of the electrolytic copper foil, the number of ultrasonic transitions (i.e., the number of frequency transitions) may be 2 or more during obtaining the electrolytic copper foil by means of electroplating. With the increase in the number of frequency transitions, the content of non-twining crystal grains in the electrolytic copper foil is lowered. However, the number of frequency transitions should not be too large. Optionally, the number of ultrasonic transitions (i.e., frequency transitions) is less than or equal to 25 per minute. Particularly, the number of ultrasonic transitions per minute (i.e., frequency transitions) is more than or equal to 2 and less than or equal to 10.

In some embodiments, in the process of obtaining the electrolytic copper foil by means of electroplating, the percentage of the total time for electroplating under conditions of an ultrasonic wave at f11 frequency and an ultrasonic wave at f12 frequency is 70%-90%, and the percentage of the total time for electroplating under conditions of an ultrasonic wave at f21 frequency and an ultrasonic wave at f22 frequency is 10%-30%.

With the total time for electroplating under conditions of an ultrasonic wave at f11 frequency and an ultrasonic wave at f12 frequency in a suitable range, in the electrolytic copper foil, the volume percentage of the twining crystal grains is higher, and the volume percentage of the (111) crystal plane is higher as well.

In some embodiments, optionally, the percentage of the total time for electroplating under conditions of an ultrasonic wave at f11 frequency and an ultrasonic wave at f12 frequency is 75%-85%, and the percentage of the total time for electroplating under conditions of an ultrasonic wave at f21 frequency and an ultrasonic wave at f22 frequency is 15%-25%.

In some embodiments, the percentage of the time for electroplating under conditions of an ultrasonic wave at f11 frequency is 40%-90%. Optionally, the percentage of the time for electroplating under conditions of an ultrasonic wave at f11 frequency is 40%-50%. With the percentage of the time for electroplating under conditions of an ultrasonic wave at f11 frequency in a suitable range, in the electrolytic copper foil, the volume percentage of the twining crystal grains is higher, and the volume percentage of the (111) crystal plane is higher as well.

In some embodiments, the percentage of the time for electroplating under conditions of an ultrasonic wave at f12 frequency is 0-50%. Optionally, the percentage of the time for electroplating under conditions of an ultrasonic wave at f12 frequency is 40%-50%.

In some embodiments, the percentage of the time for electroplating under conditions of an ultrasonic wave at f21 frequency is 0-30%. Optionally, the percentage of the time for electroplating under conditions of an ultrasonic wave at f21 frequency is 5%-25%.

In some embodiments, the percentage of the time for electroplating under conditions of an ultrasonic wave at f22 frequency is 0-10%. Optionally, the percentage of the time for electroplating under conditions of an ultrasonic wave at f22 frequency is 5%-10%.

In some embodiments, the direct current electroplating is carried out under conditions that the electroplating solution is provided with randomly alternating transitions of an ultrasonic wave at f11 frequency, an ultrasonic wave at f12 frequency, an ultrasonic wave at f21 frequency, and an ultrasonic wave at f22 frequency. In the process of obtaining the electrolytic copper foil by means of electroplating, the percentage of the time for electroplating under conditions of an ultrasonic wave at f11 frequency is 40%-50%, the percentage of the time for electroplating under conditions of an ultrasonic wave at f12 frequency is 40%-50%, the percentage of the time for electroplating under conditions of an ultrasonic wave at f21 frequency is 5%-25%, and the percentage of the time for electroplating under conditions of an ultrasonic wave at f22 frequency is 5%-10%.

In some embodiments, the current density for the direct current electroplating is 2 $A/dm^2$-80 $A/dm^2$.

The electrolytic copper foil of the present application, has a higher degree of isotropy and a higher content of twin crystals as well as more excellent electrical conductivity and mechanical properties, can also achieve the electroplating at a high current density, such that the electroplating time is reduced and the production efficiency is improved. In some embodiments, the current density for the direct current electroplating is 15 $A/dm^2$-80 $A/dm^2$. For example, the current density for the direct current electroplating is 15 $A/dm^2$-80 $A/dm^2$, 15 $A/dm^2$-70 $A/dm^2$, $A/dm^2$-60 $A/dm^2$, 15 $A/dm^2$-50 $A/dm^2$, 15 $A/dm^2$-40 $A/dm^2$, 20 $A/dm^2$-80 $A/dm^2$, 20 $A/dm^2$-70 $A/dm^2$, 20 $A/dm^2$-60 $A/dm^2$, 20 $A/dm^2$-50 $A/dm^2$, 20 $A/dm^2$-40 $A/dm^2$, 30 $A/dm^2$-80 $A/dm^2$, 30 $A/dm^2$-70 $A/dm^2$, 30 $A/dm^2$-60 $A/dm^2$, 30 $A/dm^2$-50 $A/dm^2$, or 30 $A/dm^2$-40 $A/dm^2$.

In some embodiments, the twin crystal growth agent includes one or two of gelatin and polyethyleneimine.

In some embodiments, the electroplating solution is a sulfuric acid-copper sulfate electroplating solution, and the electroplating solution comprises a twin crystal growth agent, copper ions, sulfuric acid, and chloride ions.

In some embodiments, the mass concentration of the twin crystal growth agent in the electroplating solution is 50 ppm-110 ppm. Optionally, the mass concentration of the twin crystal growth agent in the electroplating solution is 70 ppm-90 ppm. When the concentration of the twin crystal growth agent is high, the effect of electroplating and the quality of the plated layer become poor; when the concentration of the twin crystal growth agent is low, the growth of the copper crystal grains along the (101) crystal plane and the (001) crystal plane can not be inhibited, such that the content of twining crystal grains in the electrolysis copper foil is reduced. With the concentration of the twin crystal growth agent in a suitable range, the quality of the plated layer can be improved, and the degree of isotropy and the content of twin crystals of the electrolytic copper foil are also improved.

In some embodiments, the concentration of sulfuric acid in the electroplating solution is 40 g/L-70 g/L. Optionally, the concentration of sulfuric acid in the electroplating solution is 50 g/L-60 g/L. When the concentration of sulfuric acid is high, the solubility of copper sulfate in the electroplating solution decreases, a saturation state is prone to be reached at the interface between two phases, and copper sulfate is formed by too many copper ions and sulfate ions and crystallized out at the anode, which hinders the normal dissolution process of the anode and easily passivating the anode; when the concentration of sulfuric acid is low, the plated layer is rough and the anode is also prone to be passivated. With the concentration of sulfuric acid in a suitable range, the effect of electroplating and the quality of the plated layer are better.

In some embodiments, the concentration of copper ions in the electroplating solution is 50 g/L-100 g/L. Optionally, the concentration of copper ions in the electroplating solution is 70 g/L-80 g/L. When the concentration of copper ions is high, copper sulfate is prone to be crystallized out; when the concentration of copper ions is low, the electrical conductivity of the electroplating solution is low, and the current density that can be used during electroplating is also reduced. With the concentration of copper ions in a suitable range, it not only can realize electroplating at a high current density, but also can improve the effect of electroplating and the quality of the plated layer.

When preparing the electroplating solution, the source of the copper ions may be a copper salt, such as copper sulfate.

In some embodiments, the mass concentration of chloride ions in the electroplating solution is 20 ppm-50 ppm. Optionally, the mass concentration of chloride ions in the electroplating solution is 30 ppm-40 ppm. When the concentration of chloride ions is high, the plated layer is prone to have pocking marks, streaks and dendritic stripes, which affect the leveling performance of the plated layer; when the concentration of chloride ions is low, the brightness of the plated layer is reduced. With the concentration of chloride ions in a suitable range, the plated layer has better leveling performance and brightness.

When preparing the electroplating solution, the source of the chloride ions may be hydrochloric acid, sodium chloride, and potassium chloride.

In some embodiments, the electroplating solution may further comprise a solvent of water.

In some embodiments, the electroplating solution further comprises a leveling agent and a brightening agent. The leveling agent can improve the micro-dispersing ability of the electroplating solution, and enables a smoother surface of the plated layer; the brightening agent can improve the brightness and the brightness range of the plated layer.

Optionally, the leveling agent includes polypeptide protein.

Optionally, the brightening agent includes one or more of sodium polydithiodipropane sulfonate and sodium 3-mercaptopropane sulfonate.

In some embodiments, the concentration of the leveling agent in the electroplating solution is 20 ml/L-40 ml/L. Optionally, the concentration of the leveling agent in the electroplating solution is 25 ml/L-35 ml/L. When the content of the leveling agent is low, the surface of the electrolytic copper foil obtained by means of electroplating is not smooth enough and is prone to have pittings; when the content of the leveling agent is high, the electrolytic copper foil is prone to have increased brittleness and reduced toughness.

In some embodiments, the concentration of the brightening agent in the electroplating solution is 10 ml/L-30 ml/L. Optionally, the concentration of the brightening agent in the electroplating solution is 15 ml/L-25 ml/L. When the content of the brightening agent is low, the electrolytic copper foil obtained by means of electroplating has poor a brightness and a small brightness range; when the content of the brightening agent is high, the electrolytic copper foil is prone to have increased brittleness and reduced toughness.

In some embodiments, the temperature for the direct current electroplating is room temperature, for example, 25° C.±5° C.

In some embodiments, the anode is high-purity cast copper, and optionally, the high-purity cast copper can be wrapped by a titanium basket.

In some embodiments, the cathode is a high-purity titanium plate, and the main component of the titanium plate is titanium. Certainly, cathodes made of other materials can also be used as a substrate for electroplating deposition, for example, metal copper, metal nickel, etc.

In some embodiments, before step S10, the method for preparing an electrolytic copper foil further includes steps of oil removing, acid pickling and washing with water of the cathode, to remove the greasy dirts, oxide layers, etc., on the surface.

In some embodiments, before step S10, the method for preparing an electrolytic copper foil further includes a step of externally connecting an ultrasonic generator below the electroplating tank. The ultrasonic generator in the present application can be directly provided below the initial electroplating tank, without replacing the tank body of the electroplating tank, such that the process is simplified and the production efficiency is improved. The number of the ultrasonic generators may be 1, and also may be multiple, for example, 2 or 3.

In some embodiments, the method for preparing an electrolytic copper foil further includes a step of separating the deposited electrolytic copper foil by electroplating from the cathode.

The electrolytic copper foil prepared by the method of the present application has a higher degree of isotropy.

In some embodiments, the volume percentage of the (111) crystal plane of the electrolytic copper foil is ≥60%. Optionally, the volume percentage of the (111) crystal plane of the electrolytic copper foil is ≥70%. Further optionally, the volume percentage of the (111) crystal plane of the electrolytic copper foil is ≥80%.

In some embodiments, the volume percentage of the twining crystal grains in the electrolytic copper foil is ≥60%. Optionally, the volume percentage of the twining crystal grains in the electrolytic copper foil is ≥70%. Further optionally, the volume percentage of the twining crystal grains in the electrolytic copper foil is ≥80%.

The electrolytic copper foil prepared by the method of the present application has excellent electrical conductivity and mechanical properties.

In some embodiments, the normal-temperature tensile strength of the electrolytic copper foil is ≥50 kg/mm$^2$. Optionally, the normal-temperature tensile strength of the electrolytic copper foil is ≥55 kg/mm$^2$. Further optionally, the normal-temperature tensile strength of the electrolytic copper foil is ≥60 kg/mm$^2$.

In some embodiments, the Vickers hardness of the electrolytic copper foil is ≥180. Optionally, the Vickers hardness of the electrolytic copper foil is ≥185. Further optionally, the Vickers hardness of the electrolytic copper foil is ≥190.

In some embodiments, the thickness of the electrolytic copper foil is 4 μm-20 μm.

Secondary Battery

A secondary battery, also known as a rechargeable battery or an accumulator, refers to a battery of which active materials can be activated by means of charging for reuse of the battery after the battery is discharged.

Generally, the secondary battery comprises a positive electrode plate, a negative electrode plate, a separator and an electrolyte. During a charge/discharge process of the battery, active ions (e.g., lithium ions, sodium ions, etc.) are intercalated and de-intercalated back and forth between the positive electrode plate and the negative electrode plate. The separator is provided between the positive electrode plate and the negative electrode plate, and mainly prevents positive and negative electrodes from short-circuiting and enables the active ions to pass through. The electrolyte is provided between the positive electrode plate and the negative electrode plate and mainly functions for active ion conduction.

[Negative Electrode Plate]

The secondary battery comprises a negative electrode plate. The negative electrode plate typically comprises a negative electrode current collector and a negative electrode film layer that is provided on at least one surface of the negative electrode current collector and comprises a negative electrode active material. For example, the negative electrode current collector has two surfaces opposite in its own thickness direction, and the negative electrode film layer is laminated on either or both of the two opposite surfaces of the negative electrode current collector.

In the negative electrode plate of the present application, the negative electrode film layer typically comprises a negative electrode active material and an optional binder, an optional conductive agent and other optional auxiliary agents. The negative electrode film layer is usually formed by coating a negative electrode slurry on a negative electrode current collector, and drying and cold pressing same. The negative electrode slurry is generally formed by dispersing a negative electrode active material, and an optional conductive agent, an optional binder, an optional auxiliary agent, etc., into a solvent and uniformly stirring same. The solvent may be N-methylpyrrolidone (NMP) or deionized water, but is not limited thereto. The type and content of the conductive agent and the binder is not specifically limited, and can be selected according to actual requirements. As an example, the conductive agent may include one of more of superconducting carbon, carbon black (for example, acetylene black, Ketjen black, etc.), carbon dots, carbon nanotubes, graphene, and carbon nanofibers. As an example, the binder may include one or more of a styrene-butadiene rubber (SBR), a water-soluble unsaturated resin (SR-1B), a water-based acrylic resin (for example, polyacrylic acid PAA, polymethacrylic acid PMAA, and sodium polyacrylate PAAS), polyacrylamide (PAM), polyvinyl alcohol (PVA), sodium alginate (SA), and carboxymethyl chitosan (CMCS). Other optional auxiliary agents may include a thickening agent (e.g., sodium carboxymethyl cellulose CMC-Na), a PTC thermistor material, etc.

In some embodiments, the type of the negative electrode active material is not specifically limited, and may be a negative electrode active material for secondary batteries that is well known in the art. As an example, the negative electrode active material may include one or more of graphite, soft carbon, hard carbon, mesophase micro carbon spheres, carbon fibers, carbon nanotubes, a silicon-based material, a tin-based material, and lithium titanate. The silicon-based material may include one or more of elemental silicon, a silicon oxide, a silicon carbon composite, a silicon nitrogen composite, and a silicon alloy material. The tin-based material may include one or more of elemental tin, a tin oxide, and a tin alloy material. The present application is not limited to these materials, and other well-known conventional materials that can be used as a negative electrode active material for secondary batteries can also be used. These negative electrode active materials may be used alone or in combination of two or more.

In the negative electrode plate of the present application, the negative electrode current collector may be the electrolytic copper foil prepared by the method of the present application.

In some embodiments, the adhesive force between the negative electrode current collector and the negative electrode film layer is 10 N/m²-20 N/m².

When the electrolytic copper foil prepared in the first aspect of the present application or the electrolytic copper foil of the second aspect of the present application is used as a negative electrode current collector, the adhesive force of the negative electrode plate is significantly higher than that of the negative electrode plate using a common copper foil as the negative electrode current collector. The possible reason is that the electrolytic copper foil prepared by the method of the present application has a finer crystal grain size, so that there are more chemical bonds on the surface of this electrolytic copper foil, and the adhesive force between the electrolytic copper foil and the negative electrode active material or the like is stronger.

[Positive Electrode Plate]

The present application provides a positive electrode plate comprising a positive electrode current collector and a positive electrode film layer which is provided on at least one surface of the positive electrode current collector and comprises a positive electrode active material. For example, the positive electrode current collector has two opposite surfaces in its own thickness direction, and the positive electrode film layer is provided on either or both of the two opposite surfaces of the positive electrode current collector.

In the positive electrode plate of the present application, the positive electrode film layer typically comprises a positive electrode active material and an optional binder and an optional conductive agent. The positive electrode film layer is usually formed by coating a positive electrode slurry on a positive electrode current collector, and drying and cold pressing same. The positive electrode slurry is usually formed by dispersing the positive electrode active material, an optional conductive agent, an optional binder and any other components in a solvent and stirring same evenly. The solvent may be N-methylpyrrolidone (NMP), but is not limited thereto. As an example, the binder for the positive electrode film layer may include one or more of polyvinylidene fluoride (PVDF), polytetrafluoroethylene (PTFE), a vinylidene fluoride-tetrafluoroethylene-propylene terpolymer, a vinylidene fluoride-hexafluoropropylene-tetrafluoroethylene terpolymer, a tetrafluoroethylene-hexafluoropropylene copolymer, and a fluorine-containing acrylate resin. As an example, the conductive agent for the positive electrode film layer may include one or more of superconductive carbon, acetylene black, carbon black, Ketjen black, carbon dots, carbon nanotubes, graphene, and carbon nanofibers.

In the positive electrode plate of the present application, the positive electrode current collector may be a metal foil or a composite current collector. As an example of the metal foil, the positive electrode current collector may be an aluminum foil. The composite current collector may comprise a polymer material substrate and a metal material layer formed on at least one surface of the polymer material substrate. As an example, the metal material may be selected from one or more of aluminum, an aluminum alloy, nickel, a nickel alloy, titanium, a titanium alloy, silver, and a silver alloy. As an example, the polymer material substrate may be selected from polypropylene (PP), polyethylene terephthalate (PET), polybutylene terephthalate (PBT), polystyrene (PS), polystyrene ethylene (PE) etc.

In the positive electrode plate of the present application, the positive electrode film layer comprises a positive electrode active material, and the positive electrode active material may be a positive electrode active material for secondary batteries that is well known in the art.

It should be noted that the secondary battery of the present application is a lithium ion battery, or a sodium ion battery.

When the secondary battery of the present application is a lithium ion battery, optionally, the positive electrode active material may include one or more of a lithium transition metal oxide, a lithium-containing phosphate with an olivine structure, and a respective modified compound thereof. An example of the lithium transition metal oxide may include, but not limited to, one or more of a lithium cobalt oxide, a lithium nickel oxide, a lithium manganese oxide, a lithium nickel cobalt oxide, a lithium manganese cobalt oxide, a lithium nickel manganese oxide, a lithium nickel cobalt manganese oxide, a lithium nickel cobalt aluminum oxide, and a respective modified compound thereof. An example of the lithium-containing phosphate with an olivine structure may include, but not limited to, one or more of lithium iron phosphate, a lithium iron phosphate-carbon composite, lithium manganese phosphate, a lithium manganese phosphate-carbon composite, lithium iron manganese phosphate, a lithium iron manganese phosphate-carbon composite, and a respective modified compound thereof. The present application is not limited to these materials, and other well-known conventional materials that can be used as the positive electrode active material for lithium ion batteries may also be used. These positive electrode active materials may be used alone or in combination of two or more.

For example, the positive electrode active material of the lithium ion battery may be selected from one or more of $LiCoO_2$, $LiNiO_2$, $LiMnO_2$, $LiMn_2O_4$, $LiNi_{1/3}Co_{1/3}Mn_{1/3}O_2$ (NCM333), $LiNi_{0.5}Co_{0.2}Mn_{0.3}O_2$ (NCM523), $LiNi_{0.6}Co_{0.2}Mn_{0.2}O_2$ (NCM622), $LiNi_{0.8}Co_{0.1}Mn_{0.1}O_2$ (NCM811), $LiNi_{0.85}Co_{0.15}Al_{0.05}O_2$, $LiFePO_4$ (LFP) and $LiMnPO_4$.

When the secondary battery of the present application is a sodium ion battery, optionally, the positive electrode active material may be selected from a transition metal oxide $Na_xMO_2$ (M is a transition metal, optionally selected from one or more of Mn, Fe, Ni, Co, V, Cu, and Cr, and $0<x\leq 1$), a polyanionic material (e.g., phosphate, fluorophosphate, pyrophosphate, sulfate, etc.), a Prussian blue material, etc. However, the present application is not limited to these materials, and other materials that can be used as the positive electrode active material for sodium ion batteries may also be used. These positive electrode active materials may be used alone or in combination of two or more.

Optionally, the positive electrode active material for the sodium ion battery may be selected from one or more of $NaFeO_2$, $NaCoO_2$, $NaCrO_2$, $NaMnO_2$, $NaNiO_2$, $NaNi_{1/2}Ti_{1/2}O_2$, $NaNi_{1/2}Mn_{1/2}O_2$, $Na_{2/3}Fe_{1/3}Mn_{2/3}O_2$, $NaNi_{1/3}Co_{1/3}Mn_{1/3}O_2$, $NaFePO_4$, $NaMnPO_4$, $NaCoPO_4$, a Prussian blue material, and a material of general formula of $A_aM_b(PO_4)_cO_xY_{3-x}$. A is selected from one or more of $H^+$, $Li^+$, $Na^+$, $K^+$ and $NH_4^+$; M is a transition metal cation, and is optionally selected from one or more of V, Ti, Mn, Fe, Co, Ni, Cu, and Zn; Y is a halogen anion, and is optionally selected from one or more of F, Cl, and Br; $0<a\leq 4$, $0<b\leq 2$, $1\leq c\leq 3$, and $0\leq x\leq 2$.

In some embodiments, the modified compounds of the positive electrode active materials described above can be obtained from the doping modification, surface coating modification, or doping and surface coating modification of the positive electrode active materials.

[Electrolyte]

The electrolyte is between the positive electrode plate and the negative electrode plate and functions for active ion conduction. There is no specific limitation on the type of electrolyte in the secondary battery of the present application, and it can be selected according to the requirement. For example, the electrolyte may be at least one selected from a solid electrolyte and a liquid electrolyte (i.e., electrolyte solution).

In some embodiments, an electrolyte solution is used as the electrolyte. The electrolyte solution comprises an electrolyte salt and a solvent.

In some embodiments, the type of the electrolyte salt is not specifically limited, and can be selected according to actual requirements. When the secondary battery of the present application is a lithium ion battery, optionally, the electrolyte salt may be selected from one or more of lithium hexafluorophosphate ($LiPF_6$), lithium tetrafluoroborate ($LiBF_4$), lithium perchlorate ($LiClO_4$), lithium hexafluoroarsenate ($LiAsF_6$), lithium bisfluorosulfonimide (LiFSI), lithium bistrifluoromethanesulfonimide (LiTFSI), lithium trifluoromethanesulfonate (LiTFS), lithium difluorooxalate borate (LiDFOB), lithium dioxalate borate (LiBOB), lithium difluorophosphate ($LiPO_2F_2$), lithium bisoxalatodifluorophosphate (LiDFOP) and lithium tetrafluorooxalate phosphate (LiTFOP). When the secondary battery of the present application is a sodium ion battery, optionally, the electrolyte salt may be selected from one or more of $NaPF_6$, $NaClO_4$, $NaBCl_4$, $NaSO_3CF_3$, and $Na(CH_3)C_6H_4SO_3$.

In some embodiments, the type of the solvent is not specifically limited, and can be selected according to actual requirements. As an example, the solvent may be selected from one or more of ethylene carbonate (EC), propylene carbonate (PC), ethyl methyl carbonate (EMC), diethyl carbonate (DEC), dimethyl carbonate (DMC), dipropyl carbonate (DPC), methyl propyl carbonate (MPC), ethyl propyl carbonate (EPC), butylene carbonate (BC), fluoroethylene carbonate (FEC), methyl formate (MF), methyl acetate (MA), ethyl acetate (EA), propyl acetate (PA), methyl propionate (MP), ethyl propionate (EP), propyl propionate (PP), methyl butyrate (MB), ethyl butyrate (EB), 1,4-butyrolactone (GBL), sulfolane (SF), dimethyl sulfone (MSM), ethyl methyl sulfone (EMS) and diethyl sulfone (ESE).

In some embodiments, optionally, the solvent is a non-aqueous solvent.

In some embodiments, the electrolyte solution may optionally comprise an additive. For example, the additive may include a negative electrode film-forming additive, a positive electrode film-forming additive, and also an additive that can improve certain performance of the battery, such as an additive to improve the overcharge performance of a battery, an additive to improve the high temperature performance of a battery, and an additive to improve the low temperature performance of a battery, etc.

[Separator]

The secondary battery using an electrolyte solution and some secondary batteries using a solid electrolyte further comprise a separator. The separator is provided between the positive electrode plate and the negative electrode plate, and functions for separation. The type of the separator is not particularly limited in the present application, and any well known porous-structure separator with good chemical stability and mechanical stability may be selected. In some embodiments, the material of the separator may be selected from one or more of glass fibers, a non-woven, polyethylene, polypropylene and polyvinylidene fluoride. The separator may be either a single-layer film or a multi-layer composite film. When the separator is a multi-layer composite film, the materials of the layers may be the same or different.

In some embodiments, an electrode assembly may be formed by a positive electrode plate, a negative electrode plate and a separator by a winding process or a stacking process.

In some embodiments, the secondary battery may comprise an outer package. The outer package can be used to encapsulate the above-mentioned electrode assembly and electrolyte.

In some embodiments, the outer package of the secondary battery can be a hard shell, for example, a hard plastic shell, an aluminum shell, a steel shell, etc. The outer package of the secondary battery may also be a soft bag, such as a pouch-type soft bag. The material of the soft bag may be plastics, such as one or more of polypropylene (PP), polybutylene terephthalate (PBT), polybutylene succinate (PBS), etc.

Figure 1:
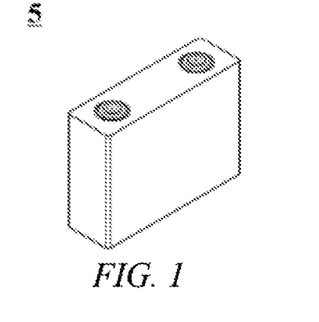
FIG. 1 is a schematic diagram of an embodiment of the secondary battery of the present application.

The shape of the secondary battery is not particularly limited in the present application, and may be cylindrical, square or of any other shape. FIG. 1 shows a square secondary battery 5 as an example.

Figure 2:
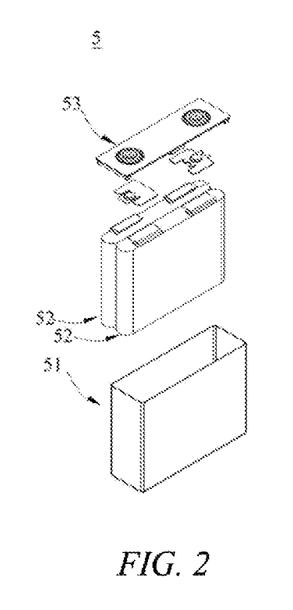
FIG. 2 is an exploded schematic diagram of an embodiment of a secondary battery of the present application.

In some embodiments, with reference to FIG. 2, the outer package may include a housing 51 and a cover plate 53. The housing 51 may include a bottom plate and side plates connected to the bottom plate, and the bottom plate and the side plates enclose to form an accommodating cavity. The housing 51 has an opening in communication with the accommodating cavity, and the cover plate 53 is used for covering the opening to close the accommodating cavity. The positive electrode plate, the negative electrode plate and the separator can be subjected to a winding process or a stacking process to form an electrode assembly 52. The electrode assembly 52 is packaged in the accommodating cavity. The electrolyte infiltrates the electrode assembly 52. The number of the electrode assemblies 52 contained in the secondary battery 5 may be one or more, and may be adjusted according to requirements.

In some embodiments, the secondary battery can be assembled into a battery module, and the number of the secondary batteries contained in the battery module can be multiple, and the specific number can be adjusted according to the application and capacity of the battery module.

Figure 3:
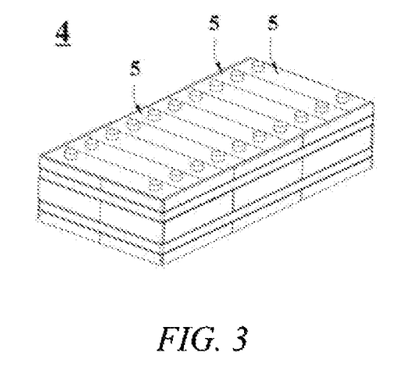
FIG. 3 is a schematic diagram of an embodiment of the battery module of the present application.

FIG. 3 is an exemplary battery module 4. Referring to FIG. 3, in the battery module 4, a plurality of secondary batteries 5 may be arranged in sequence in the length direction of the battery module 4. Apparently, the secondary batteries may also be arranged in any other manner. Furthermore, the plurality of secondary batteries 5 may be fixed by fasteners.

Optionally, the battery module 4 may also comprise a housing with an accommodating space, and a plurality of secondary batteries 5 are accommodated in the accommodating space.

In some embodiments, the above battery module may also be assembled into a battery pack, and the number of the battery modules contained in the battery pack can be adjusted according to the application and capacity of the battery pack.

Figure 4:
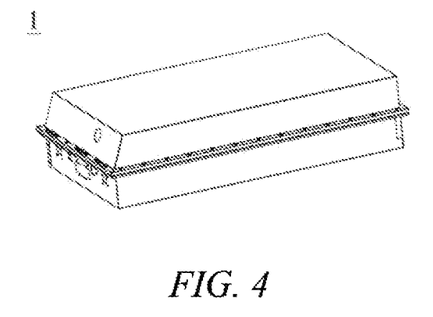
FIG. 4 is a schematic diagram of an embodiment of the battery pack of the present application.
Figure 5:
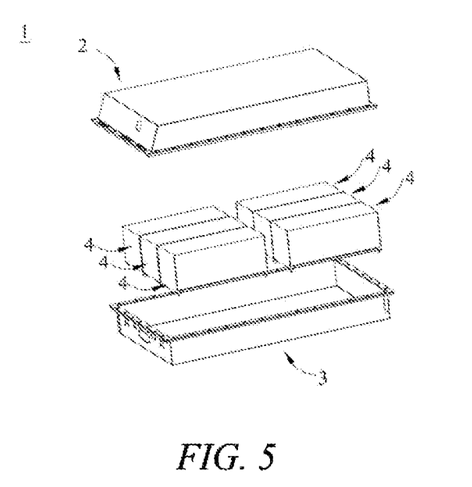
FIG. 5 is an exploded view of FIG. 4.

FIG. 4 and FIG. 5 show an exemplary battery pack 1. Referring to FIG. 4 and FIG. 5, the battery pack 1 may comprise a battery case and a plurality of battery modules 4 provided in the battery case. The battery case includes an upper case body 2 and a lower case body 3, and the upper case body 2 is used to cover the lower case body 3 to form a closed space for accommodating the battery modules 4. A plurality of battery modules 4 may be arranged in the battery case in any manner.

Power Consuming Device

Embodiments of the present application further provide a power consuming device comprising at least one of the secondary battery, battery module, and battery pack of the present application. The secondary battery, battery module or battery pack may be used as a power supply of the power consuming device or as an energy storage unit of the power consuming device. The power consuming device may be, but is not limited to, a mobile device (e.g., a mobile phone, a laptop computer, etc.), an electric vehicle (e.g., a pure electric vehicle, a hybrid electric vehicle, a plug-in hybrid electric vehicle, an electric bicycle, an electric scooter, an electric golf cart, an electric truck, etc.), an electric train, ship and satellite, an energy storage system, etc.

The power consuming device may incorporate the secondary battery, battery module or battery pack according to its usage requirements.

Figure 6:
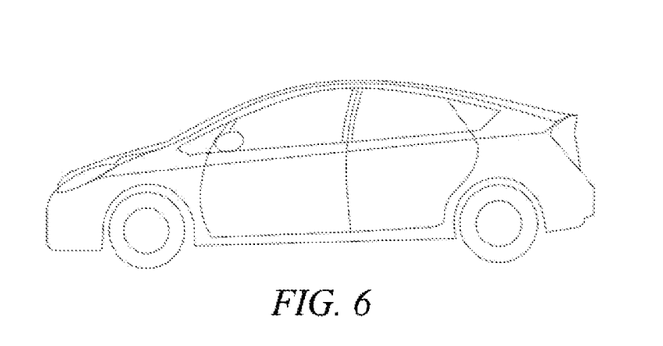
FIG. 6 is a schematic diagram of an embodiment of a power consuming device using the secondary battery of the present application as a power supply.

FIG. 6 shows a power consuming device as an example. The power consuming device may be a battery electric vehicle, a hybrid electric vehicle, a plug-in hybrid electric vehicle, or the like. In order to meet the requirements of the power consuming device for a high power and a high energy density, a battery pack or a battery module may be used.

As another example, the power consuming device may be a mobile phone, a tablet, a laptop computer, etc. The power consuming device is generally required to be thin and light, and may use a secondary battery as a power supply.

EXAMPLES

The following examples more specifically describe the content disclosed in the present application, and these examples are only used for explanatory description, because various modifications and transitions within the scope of the present disclosure are obvious to those skilled in the art. Unless otherwise noted, all parts, percentages and ratios reported in the following examples are on a weight basis, and all reagents used in the examples are commercially available or are synthesized according to conventional methods, and can be used directly without further treatment, and the instruments used in the examples are commercially available.

Example 1

(1) Preparation of Electroplating Solution

Copper sulfate, sulfuric acid, sodium chloride, a twin crystal growth agent, a leveling agent, and a brightening agent are dissolved in water, fully stirred and mixed uniformly. The concentrations of the components are respectively: 75 g/L of copper ions, 55 g/L of sulfuric acid, ppm of chloride ions, 85 ppm of the twin crystal growth agent, 30 ml/L of the leveling agent, and 20 ml/L of the brightening agent.

(2) Direct Current Electroplating

Figure 7:
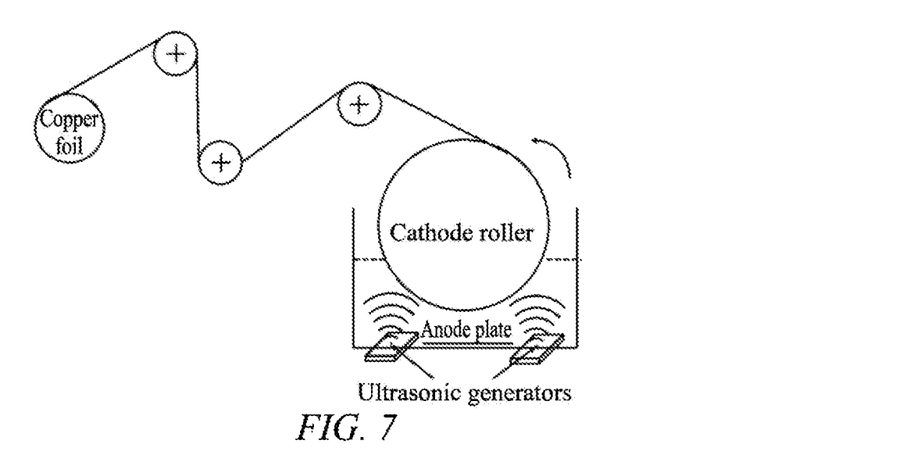
FIG. 7 is a schematic diagram of a device for the electrolytic copper foil of the present application.

Referring to FIG. 7, at 25±5° C., an anode plate, and a cathode roller to be plated are immersed into the electroplating solution, and 2 ultrasonic generators are provided below the bottom of the electroplating tank. The direct current electroplating is carried out under conditions of providing ultrasonic waves, with a current density of 30 A/dm$^2$, and the total time for electroplating is 45 min. In the process of electroplating, the scheme for the ultrasonic frequency transition is as follows: 28 kHz-45 kHz-28 kHz-0 kHz-10 kHz-45 kHz, multiple recycling frequency transitions are carried out successively, the total number of frequency transitions is 269, and the percentage of the ultrasonic time under ultrasonic waves at different frequencies is as follows: 15%-20%-25%-5%-15%-20%. The electrolytic copper foil obtained after electroplating has a thickness of 6 μm.

Examples 2-12

The method for preparing an electrolytic copper foil is similar to that in Example 1, except that the relevant parameters during electroplating are adjusted and controlled, and see Table 1 for specific details.

Comparative Examples 1-4

The method for preparing an electrolytic copper foil is similar to that in Example 1, except that A single-frequency ultrasonic wave is used during electroplating. See Table 1 for specific parameters.

Test Section
(1) Volume Percentages of Different Crystal Planes and of Different Crystal Grains of Electrolytic Copper Foil The method of Electron Backscattered Diffraction is used.

(2) Roughness of Electrolytic Copper Foil

Test on the surface roughness Rz of the electrolytic copper foil: the measurement is carried out by using a contact roughness meter according to the JIS94 specification.

(3) Electric Conductivity of Electrolytic Copper Foil

Test on the electric conductivity of the electrolytic copper foil (% IACS, International Annealed Copper Standard): a four-point probe is used to measure the electrical resistance of the foil, and the electric conductivity is calculated combined with the thickness of the electrolytic copper foil (the thickness of the copper foil is converted by unit weight).

(4) Tensile Strength of Electrolytic Copper Foil

Test on the tensile strength RTS of the electrolytic copper foil: the electrolytic copper foil after electroplating is left to stand for no less than 24 hours, and the specimen is pressed into a dumbbell shape (with a gauge length of 50 mm and a width of 3 mm) for testing.

(5) Vickers Hardness of Electrolytic Copper Foil

Test on the Vickers hardness Hv of the electrolytic copper foil: a square-shaped cone diamond indenter having a vertex angle of 136° is pressed into the surface of electrolytic copper foil by an electronic universal testing machine with a load of less than 120 kg, and the Vickers hardness Hv of the electrolytic copper foil is obtained by dividing the load value by the surface area of the indentation pit.

(6) Adhesive Force of Negative Electrode Plate

A negative electrode active material of graphite, a conductive agent of conductive carbon, a binder of styrene-butadiene rubber and a thickening agent of sodium carboxymethyl cellulose (CMC-Na) are mixed at a mass ratio of 96.8:0.4:1.8:1, then a solvent of deionized water is added, and fully stirred by a well-known method in the art to obtain a negative electrode slurry; the negative electrode slurry is uniformly coated onto the electrolytic copper foils in examples 1-12 and comparative examples 1-4, and dried to obtain negative electrode film layers, followed by a cold-pressing procedure to obtain negative electrode plates. The negative electrode plates have a compacted density of 1.68 g/cm$^3$ and a coating surface density of 134 g/m$^2$.

Figure 8:
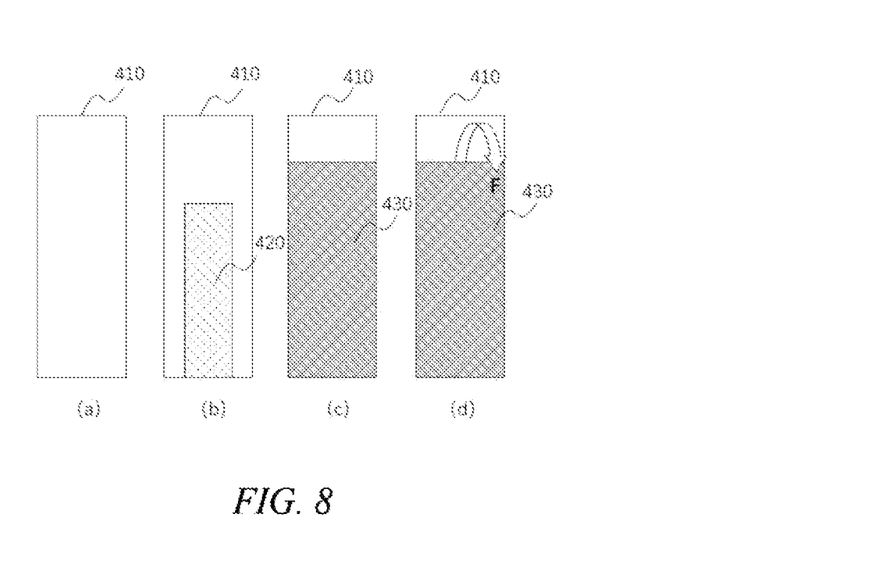
FIG. 8 is a schematic diagram of a test on the adhesive force of the negative electrode plate.

FIG. 8 is a schematic diagram of a test on the adhesive force of the negative electrode plate. As shown in FIG. 8(a), first, a steel plate 410 is provided, with the size of the steel plate being 30 mm width×100 mm length. As shown in FIG. 8(b), then, a double-sided adhesive tape 420 with a size of 20 mm width×30 mm length is provided, and the double-sided adhesive tape 420 is adhered onto the steel plate 410, with a width side of the double-sided adhesive tape 420 being aligned with a width side of the steel plate 410. As shown in FIG. 8(c), then, an electrode plate to be tested 430 is provided, with the size of the electrode plate to be tested 430 being 30 mm width×70 mm length. The electrode plate to be tested 430 is covered on the double-sided adhesive tape 420, with the coating surface of the electrode plate 430 facing the double-sided adhesive tape 420, and a width side of the electrode plate to be tested 430 being aligned with a width side of the steel plate 410. Since the length of the electrode plate to be tested 430 is longer than that of the double-sided adhesive tape 420, some areas of the electrode plate to be tested 430 are not bonded to the double-sided adhesive tape. As shown in FIG. 8(d), the steel plate 410 is fixed on the base of a tensile testing machine, the end that is not bonded with the double-sided adhesive tape of the electrode plate to be tested 430 is clamped by a clamp, and then the clamp is stretched towards the direction of the other end (as shown by the arrow), with the direction of the stretching force being parallel to the length direction of the steel plate 410 and close to the surface of the steel plate 410. The electrode plate 430 is gradually peeled away from the steel plate during stretching. The stretching speed of the clamp is 50 mm/min during the stretching. In the process of stretching, the tension force of the clamp is recorded, the peeling in 30 mm length is not started until the tension force is stable, and the average tension force over this peeling length is considered as the adhesive force.

Table 1 shows the parameters of examples 1-12 and comparative examples 1-4, and Table 2 and Table 3 show the test results of examples 1-12 and comparative examples 1-4.

TABLE 1

| | Total time for electroplating (min) | Number of frequency transitions | Frequency transition of ultrasonic waves | Current density (A/dm$^2$) | Thickness (μm) |
|---|---|---|---|---|---|
| Example 1 | 45 | 269 | 28 kHz-45 kHz-28 kHz-0 kHz-10 kHz-45 kHz (15%-20%-25%-5%-15%-20%) | 30 | 6 |
| Example 2 | 27 | 161 | 28 kHz-45 kHz-28 kHz-0 kHz-10 kHz-45 kHz (15%-20%-25%-5%-15%-20%) | 50 | 6 |
| Example 3 | 17 | 101 | 28 kHz-45 kHz-28 kHz-0 kHz-10 kHz-45 kHz (15%-20%-25%-5%-15%-20%) | 80 | 6 |
| Example 4 | 90 | 539 | 28 kHz-45 kHz-28 kHz-0 kHz-10 kHz-45 kHz (15%-20%-25%-5%-15%-20%) | 15 | 6 |
| Example 5 | 180 | 1079 | 28 kHz-45 kHz-28 kHz-0 kHz-10 kHz-45 kHz (15%-20%-25%-5%-15%-20%) | 7.5 | 6 |
| Example 6 | 45 | 539 | 28 kHz-45 kHz-28 kHz-0 kHz-10 kHz-45 kHz (15%-20%-25%-5%-15%-20%) | 30 | 6 |
| Example 7 | 45 | 1079 | 28 kHz-45 kHz-28 kHz-0 kHz-10 kHz-45 kHz (15%-20%-25%-5%-15%-20%) | 30 | 6 |
| Example 8 | 45 | 137 | 28 kHz-45 kHz-28 kHz-0 kHz-10 kHz-45 kHz (15%-20%-25%-5%-15%-20%) | 30 | 6 |

TABLE 1-continued

| | Total time for electroplating (min) | Number of frequency transitions | Frequency transition of ultrasonic waves | Current density (A/dm$^2$) | Thickness (μm) |
|---|---|---|---|---|---|
| Example 9 | 45 | 134 | 28 kHz-0 kHz-10 kHz (80%-5%-15%) | 30 | 6 |
| Example 10 | 15 | 224 | 28 kHz-45 kHz-28 kHz-0 kHz-45 kHz (15%-28%-32%-5%-20%) | 30 | 6 |
| Example 11 | 45 | 134 | 10 kHz-0 kHz-45 kHz (15%-5%-80%) | 30 | 6 |
| Example 12 | 45 | 224 | 28 kHz-45 kHz-28 kHz-10 kHz-45 kHz (15%-20%-25%-20%-20%) | 30 | 6 |
| Comparative example 1 | 45 | 0 | 0 kHz | 30 | 6 |
| Comparative example 2 | 45 | 0 | 10 kHz | 30 | 6 |
| Comparative example 3 | 45 | 0 | 28 kHz | 30 | 6 |
| Comparative example 4 | 45 | 0 | 45 kHz | 30 | 6 |

TABLE 2

| | Volume percentage of (111) crystal plane | Volume percentage of (101) crystal plane | Volume percentage of (001) crystal plane | Volume percentage of twining equiaxed grains | Volume percentage of twining columnar grains | Volume percentage of non-twining crystal grains |
|---|---|---|---|---|---|---|
| Example 1 | 89.41% | 6.19% | 4.40% | 71% | 15% | 14% |
| Example 2 | 84.55% | 8.22% | 7.23% | 66% | 14% | 20% |
| Example 3 | 82.17% | 9.12% | 8.71% | 59% | 10% | 31% |
| Example 4 | 90.17% | 4.95% | 4.88% | 73% | 14% | 13% |
| Example 5 | 91.49% | 4.32% | 4.19% | 74% | 16% | 10% |
| Example 6 | 85.15% | 8.31% | 6.54% | 61% | 16% | 23% |
| Example 7 | 84.91% | 8.43% | 6.66% | 52% | 11% | 37% |
| Example 8 | 82.53% | 9.23% | 8.24% | 67% | 17% | 16% |
| Example 9 | 67.60% | 16.90% | 15.50% | 58% | 14% | 28% |
| Example 10 | 78.20% | 11.70% | 10.10% | 67% | 19% | 14% |
| Example 11 | 72.40% | 13.70% | 13.90% | 63% | 7% | 30% |
| Example 12 | 83.10% | 9.90% | 7.00% | 68% | 16% | 16% |
| Comparative example 1 | 51.30% | 25.60% | 23.10% | 29% | 27% | 44% |
| Comparative example 2 | 63.10% | 17.30% | 19.60% | 44% | 20% | 36% |
| Comparative example 3 | 63.40% | 19.40% | 17.20% | 53% | 16% | 31% |
| Comparative example 4 | 67.50% | 14.30% | 18.20% | 59% | 17% | 24% |

TABLE 3

| | Roughness Rz | IACS (%) | Tensile strength RTS (kg/mm$^2$) | Vickers hardness Hv | Adhesive force (N/m$^2$) |
|---|---|---|---|---|---|
| Example 1 | 1.6 | 97.8 | 65.1 | 196.3 | 17.2 |
| Example 2 | 1.7 | 97.2 | 58.4 | 187.4 | 16.6 |
| Example 3 | 2 | 96.3 | 54.3 | 182.1 | 15.3 |
| Example 4 | 1.5 | 97.8 | 65.9 | 197.2 | 17 |
| Example 5 | 1.3 | 97.9 | 66.7 | 198.5 | 17.5 |
| Example 6 | 1.4 | 96.8 | 60.4 | 193.6 | 17.2 |
| Example 7 | 1.1 | 96.3 | 54.8 | 183.4 | 16.5 |
| Example 8 | 1.7 | 97.1 | 61.7 | 186.9 | 16.7 |
| Example 9 | 1.6 | 96.3 | 52.4 | 177.3 | 14.5 |
| Example 10 | 1.7 | 96.8 | 56.8 | 191.4 | 15.3 |
| Example 11 | 1.5 | 96.4 | 55.3 | 187.3 | 14.9 |
| Example 12 | 1.6 | 96.9 | 57.9 | 193.6 | 16.8 |
| Comparative example 1 | 1.9 | 95.7 | 37.5 | 78.7 | 9.2 |
| Comparative example 2 | 2 | 96.1 | 43.2 | 150.8 | 13.2 |
| Comparative example 3 | 2 | 96.1 | 47.3 | 174.1 | 14.5 |
| Comparative example 4 | 1.9 | 96.4 | 51.6 | 177.7 | 14.7 |

It can be seen from the data results in Table 2 that with the electroplating at different high-speed current densities, all electrolytic copper foils of examples 1-12 grow along the (111) crystal plane (the closest-packed plane) at a large percentage, and the degree of isotropy of the electrolytic copper foils is higher; in addition, the content of the twinning crystal grains (including twining equiaxed grains and twining columnar grains) in the electrolytic copper foil is also higher, and the electrolytic copper foil is more stable and denser and has better mechanical properties.

From the data results in Table 3, it can be seen that the electrolytic copper foil prepared by the method of the present application has significantly improved tensile strength and Vickers hardness, and the probability of breakage and crumpling of the negative electrode plate in the secondary battery preparation process can be reduced significantly.

It also can be seen from the data results in Table 3 that the adhesive force of a negative electrode plate also can be improved when the electrolytic copper foil prepared by the method of the present application is applied in the negative electrode plate, such that the probability of powder shedding of the negative electrode film layer is reduced.

It should be noted that the present application is not limited to the above embodiments. The above embodiments are exemplary only, and any embodiment that has substantially same constitutions as the technical ideas and has the same effects within the scope of the technical solution of the present application falls within the technical scope of the present application. In addition, without departing from the gist of the present application, various modifications that can be conceived by those skilled in the art to the embodiments, and other modes constructed by combining some of the constituent elements of the embodiments also fall within the scope of the present application.

What is claimed is:

1. A method for preparing an electrolytic copper foil, comprising:
    placing an anode and a cathode to be plated in a twin crystal growth agent containing electroplating solution in an electroplating tank, wherein the twin crystal growth agent comprises one or two of a gelatin and polyethyleneimine; and
    under conditions that the electroplating solution is provided with randomly alternating transitions of one or two of an ultrasonic wave at a frequency f11 and an ultrasonic wave at a frequency f12 and one or two of an ultrasonic wave at a frequency f21 and an ultrasonic wave at a frequency f22, performing direct current electroplating to obtain the electrolytic copper foil, wherein 40 kHz<f11≤100 kHz, 15 kHz<f12≤40 kHz, 0 kHz<f21≤15 kHz, and f22=0 kHz;
    wherein during the electroplating to obtain the electrolytic copper foil:
        a percentage of a total time for electroplating under conditions of the ultrasonic wave at the frequency f11 and the ultrasonic wave at the frequency f12 is 70%-90%, and a percentage of a total time for electroplating under conditions of the ultrasonic wave at the frequency f21 and the ultrasonic wave at the frequency f22 is 10%-30%; and
        a number of ultrasonic transitions is 2 or more, and a number of ultrasonic transitions per minute is less than or equal to 25.

2. The method according to claim 1, wherein during the electroplating to obtain the electrolytic copper foil:
    the percentage of the total time for electroplating under conditions of the ultrasonic wave at the frequency f11 and the ultrasonic wave at the frequency f12 75%-85%, and the percentage of the total time for electroplating under conditions of the ultrasonic wave at the frequency f21 and the ultrasonic wave at the frequency f22 15%-25%.

3. The method according to claim 1, wherein during the electroplating to obtain the electrolytic copper foil:
    a percentage of a time for electroplating under conditions of the ultrasonic wave at the frequency f11 is 40%-90%; and/or
    a percentage of a time for electroplating under conditions of the ultrasonic wave at the frequency f12 is 0-50%; and/or
    a percentage of a time for electroplating under conditions of the ultrasonic wave at the frequency f21 is 0-30%; and/or
    a percentage of a time for electroplating under conditions of the ultrasonic wave at the frequency f22 is 0-10%.

4. The method according to claim 1, wherein the direct current electroplating is carried out at a current density of 2 A/dm$^2$-80 A/dm$^2$.

5. The method according to claim 1, wherein;
    the electroplating solution is a sulfuric acid-copper sulfate electroplating solution, and the electroplating solution further comprises copper ions, sulfuric acid, and chloride ions;
    a concentration of the copper ions in the electroplating solution is 50 g/L-100 g/L;
    a concentration of the sulfuric acid in the electroplating solution is 40 g/L-70 g/L;
    a mass concentration of the chloride ions in the electroplating solution is 20 ppm-50 ppm;
    a mass concentration of the twin crystal growth agent in the electroplating solution is 50 ppm-110 ppm.

6. The method according to claim 1, wherein:
    the electroplating solution further comprises a leveling agent and a brightening agent;
    the leveling agent comprises polypeptide protein, and the brightening agent comprises one or more of sodium polydithiodipropane sulfonate, and sodium 3-mercaptopropane sulfonate;
    a concentration of the leveling agent in the electroplating solution is 20 ml/L-40 ml/L;
    a concentration of the brightening agent in the electroplating solution is 10 ml/L-30 ml/L.

* * * * *